(12) United States Patent
Chang

(10) Patent No.: US 7,598,813 B2
(45) Date of Patent: Oct. 6, 2009

(54) RADIO FREQUENCY AMPLIFIER WITH CONSTANT GAIN SETTING

(75) Inventor: Yuyu Chang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 24 days.

(21) Appl. No.: 11/944,723

(22) Filed: Nov. 26, 2007

(65) Prior Publication Data

US 2009/0134942 A1    May 28, 2009

(51) Int. Cl.
*H03F 3/04* (2006.01)
(52) U.S. Cl. .................................................. 330/311
(58) Field of Classification Search ................ 330/311, 330/296
See application file for complete search history.

(56) References Cited

U.S. PATENT DOCUMENTS 6,822,518 B1 * 11/2004 Lin et al. .................... 330/296

2009/0085664 A1 * 4/2009 Yang et al. .................. 330/277

* cited by examiner

*Primary Examiner*—Robert Pascal
*Assistant Examiner*—Khiem D Nguyen
(74) *Attorney, Agent, or Firm*—Garlick Harrison & Markison; Shayne X. Short

(57) ABSTRACT

Radio frequency amplifier with constant gain setting. A circuitry that includes triple well connected MOSFETs is employed to eliminate body effects therein. The voltage gain as presented herein, being implemented using a ratio of certain elements within the circuitry, is immune to variations in temperature, power supply voltage, and process variations. One implementation employs an array of selectable MOSFETs to allow for more than one gain setting to be provided by the amplifier. Such an amplifier has a variable/selectable gain setting. An appropriately placed MOSFET is employed to provide the desired input impedance (e.g., 50Ω). This design can be implemented using multiple n-channel metal oxide semiconductor field-effect transistors (N-MOSFETs) (some of which are triple well connected) and p-channel metal oxide semiconductor field-effect transistors (P-MOSFETs), or alternatively using P-MOSFETs and N-MOSFETs.

20 Claims, 6 Drawing Sheets

RADIO FREQUENCY AMPLIFIER WITH CONSTANT GAIN SETTING

BACKGROUND OF THE INVENTION

1. Technical Field of the Invention

The invention relates generally to communication systems; and, more particularly, it relates to amplifiers employed within communication devices employed within such communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

While transmitters generally include a data modulation stage, one or more IF stages, and a power amplifier, the particular implementation of these elements is dependent upon the data modulation scheme of the standard being supported by the transceiver. For example, if the baseband modulation scheme is Gaussian Minimum Shift Keying (GMSK), the data modulation stage functions to convert digital words into quadrature modulation symbols, which have a constant amplitude and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with a transmit power level setting to produce a phase modulated RF signal.

As another example, if the data modulation scheme is 8-PSK (phase shift keying), the data modulation stage functions to convert digital words into symbols having varying amplitudes and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with the varying amplitudes to produce a phase and amplitude modulated RF signal.

As yet another example, if the data modulation scheme is x-QAM (16, 64, 128, 256 quadrature amplitude modulation), the data modulation stage functions to convert digital words into Cartesian coordinate symbols (e.g., having an in-phase signal component and a quadrature signal component). The IF stage includes mixers that mix the in-phase signal component with an in-phase local oscillation and mix the quadrature signal component with a quadrature local oscillation to produce two mixed signals. The mixed signals are summed together and filtered to produce an RF signal that is subsequently amplified by a power amplifier.

As the desire for wireless communication devices to support multiple standards continues, recent trends include the desire to integrate more functions on to a single chip. However, such desires have gone unrealized when it comes to implementing baseband and RF on the same chip for multiple wireless communication standards. In addition, many components and/or modules within the components employed within such communication devices and wireless communication devices include many off-chip elements.

One particular type of element that is commonly used in communication devices is that of a radio frequency (RF) amplifier. While many prior art variations of RF amplifiers exist, there are still many problems within such prior art approaches including a variability of such amplifiers over temperature variations. Such temperature variations of the environment in which a communication device is implemented can be very problematic for mobile communication devices that change locations/environments relatively quickly. Moreover, process variations (e.g., process 1 performed at time 1 when manufacturing amplifier 1, and process 2 performed at time 2 when manufacturing amplifier 2) can also lead to variations in the gain of an amplifier module within a communication device. There still does not exist in the prior art an adequate means by which such a robust amplifier can be implemented.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

A novel circuitry design is presented herein that provides for a temperature, power supply, and process variation insensitive means by which an amplifier circuitry or module can be implemented for use in any of a wide variety of devices including communication devices. Generally, each transistor manufactured during a given process run will scale similarly. Also, each transistor within a particular circuitry typically varies similarly with respect to changes in the environment in which the circuitry is implemented (e.g., changes in temperature, etc.).

In many embodiments presented herein, the design is depicted using multiple n-channel metal oxide semiconductor field-effect transistors (N-MOSFETs) (some of which are triple well connected) and p-channel metal oxide semiconductor field-effect transistors (P-MOSFETs). However, it is noted that such a design can alternatively be implemented using P-MOSFETs and N-MOSFETs as well without departing from the scope and spirit of the invention.

The MOSFETs can be connected using a triple well (alternatively referred to as "tri-well") configuration (e.g., in which a source of a particular MOSFET is coupled to the substrate of the circuitry). This can be performed to eliminate body effects therein.

This novel circuitry design provides for a voltage gain that is implemented using a ratio of various elements within the circuitry (e.g., gate widths, currents through various paths within the circuitry etc.), and as such, is immune to variations in temperature, power supply voltage, process variations, and/or other perturbations which affect all of the circuitry.

Moreover, one implementation employs an array of selectable MOSFETs to allow for more than one gain setting to be provided by the amplifier. Such an amplifier has a variable/selectable gain setting. An appropriately placed MOSFET is employed to provide the desired input impedance (e.g., 50Ω).

This design also ensures a relatively high IIP3 ($3^{rd}$ order input intercept point or $3^{rd}$ order intermodulation intercept point). In other words, there is a relatively low likelihood that this novel amplifier circuitry design will suffer from undesirable intermodulation effects generated by interference from other devices.

In addition, more than one power supply voltage (e.g., 2 power supply voltages) can be employed to ensure a sufficiently sized current to flow through a triple well connected MOSFET whose source provides an output voltage node.

Figure 1:
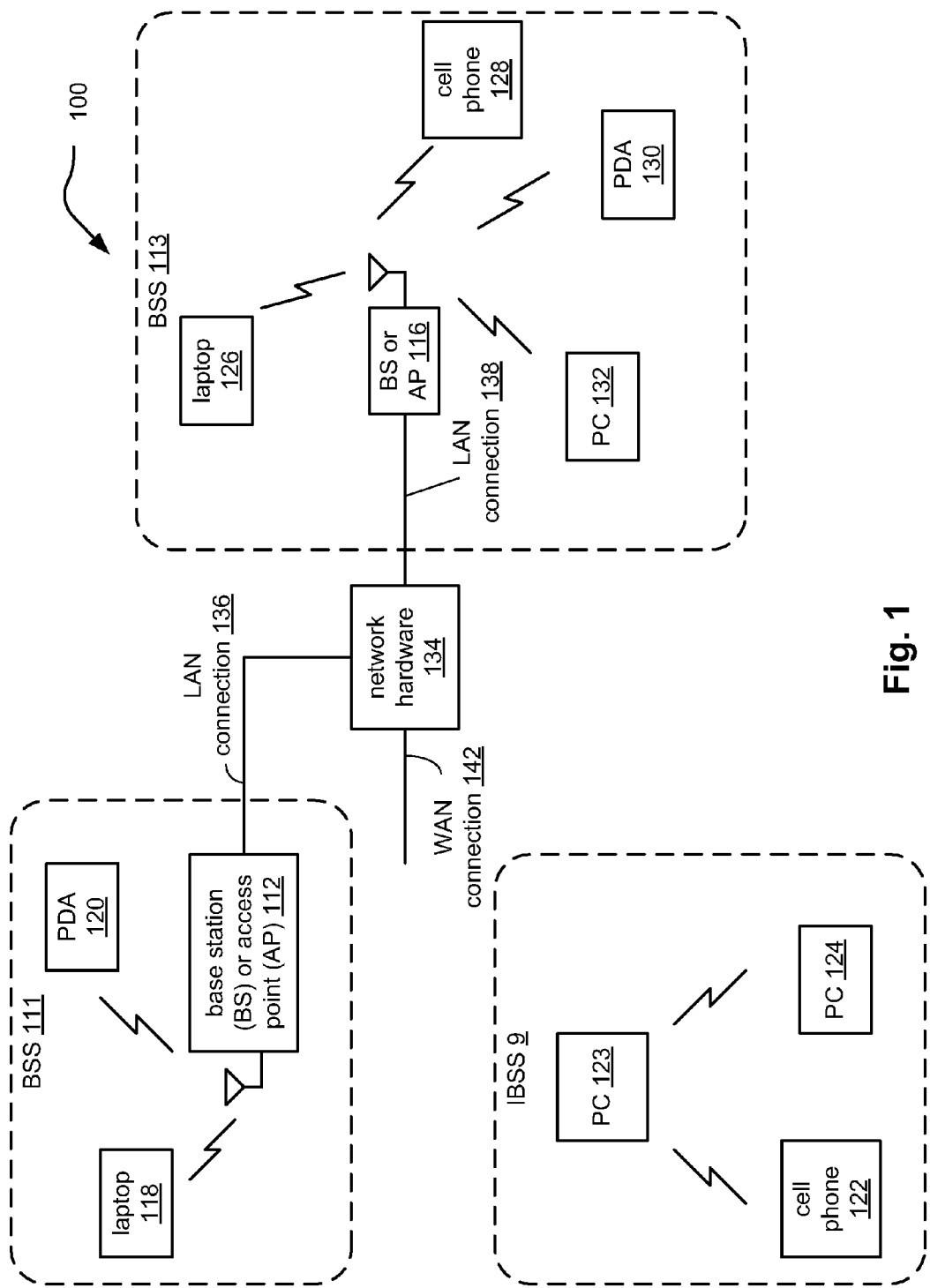
FIG. 1 is a diagram illustrating an embodiment of a wireless communication system.

FIG. 1 is a diagram illustrating an embodiment of a wireless communication system 100. The wireless communication system 100 includes a plurality of base stations and/or access points 112, 116, a plurality of wireless communication devices 118-132 and a network hardware component 134. Note that the network hardware 134, which may be a router, switch, bridge, modem, system controller, et cetera provides a wide area network connection 142 for the communication system 100. Further note that the wireless communication devices 118-132 may be laptop host computers 118 and 126, personal digital assistant hosts 120 and 130, personal computer hosts 124 and 132 and/or cellular telephone hosts 122 and 128.

Wireless communication devices 122, 123, and 124 are located within an independent basic service set (IBSS) area and communicate directly (i.e., point to point). In this configuration, these devices 122, 123, and 124 may only communicate with each other. To communicate with other wireless communication devices within the system 100 or to communicate outside of the system 100, the devices 122, 123, and/or 124 need to affiliate with one of the base stations or access points 112 or 116.

The base stations or access points 112, 116 are located within basic service set (BSS) areas 111 and 113, respectively, and are operably coupled to the network hardware 134 via local area network connections 136, 138. Such a connection provides the base station or access point 112-116 with connectivity to other devices within the system 100 and provides connectivity to other networks via the WAN connection 142. To communicate with the wireless communication devices within its BSS 111 or 113, each of the base stations or access points 112-116 has an associated antenna or antenna array. For instance, base station or access point 112 wirelessly communicates with wireless communication devices 118 and 120 while base station or access point 116 wirelessly communicates with wireless communication devices 126-132. Typically, the wireless communication devices register with a particular base station or access point 112, 116 to receive services from the communication system 100.

Typically, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), Enhanced Data rates for GSM Evolution (EDGE), General Packet Radio Service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
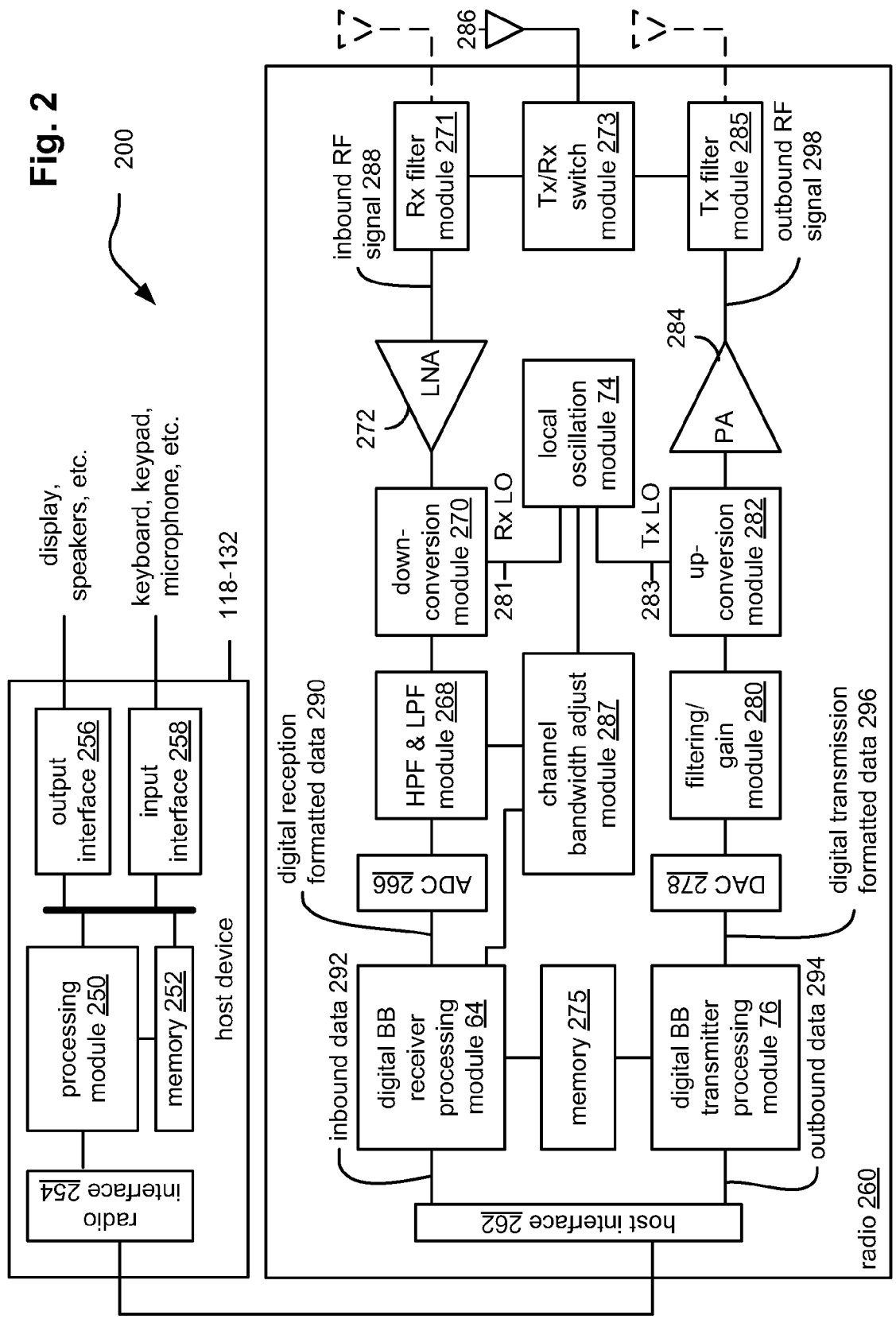
FIG. 2 is a diagram illustrating an embodiment of a wireless communication device.

FIG. 2 is a diagram illustrating an embodiment of a wireless communication device 200 that includes the host device 118-132 and an associated radio 260. For cellular telephone hosts, the radio 260 is a built-in component. For personal digital assistants hosts, laptop hosts, and/or personal computer hosts, the radio 260 may be built-in or an externally coupled component.

As illustrated, the host device 118-132 includes a processing module 250, memory 252, a radio interface 254, an input interface 258, and an output interface 256. The processing module 250 and memory 252 execute the corresponding instructions that are typically done by the host device. For example, for a cellular telephone host device, the processing module 250 performs the corresponding communication functions in accordance with a particular cellular telephone standard.

The radio interface 254 allows data to be received from and sent to the radio 260. For data received from the radio 260 (e.g., inbound data), the radio interface 254 provides the data to the processing module 250 for further processing and/or routing to the output interface 256. The output interface 256 provides connectivity to an output display device such as a display, monitor, speakers, et cetera such that the received data may be displayed. The radio interface 254 also provides data from the processing module 250 to the radio 260. The processing module 250 may receive the outbound data from an input device such as a keyboard, keypad, microphone, et cetera via the input interface 258 or generate the data itself. For data received via the input interface 258, the processing module 250 may perform a corresponding host function on the data and/or route it to the radio 260 via the radio interface 254.

Radio 260 includes a host interface 262, digital receiver processing module 264, an analog-to-digital converter 266, a high pass and low pass filter module 268, an IF mixing down conversion stage 270, a receiver filter 271, a low noise amplifier 272, a transmitter/receiver switch 273, a local oscillation module 274, memory 275, a digital transmitter processing module 276, a digital-to-analog converter 278, a filtering/gain module 280, an IF mixing up conversion stage 282, a power amplifier 284, a transmitter filter module 285, a channel bandwidth adjust module 287, and an antenna 286. The antenna 286 may be a single antenna that is shared by the transmit and receive paths as regulated by the Tx/Rx switch 273, or may include separate antennas for the transmit path and receive path. The antenna implementation will depend on the particular standard to which the wireless communication device 200 is compliant.

The digital receiver processing module 264 and the digital transmitter processing module 276, in combination with operational instructions stored in memory 275, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 264 and 276 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 275 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 264 and/or 276 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 260 receives outbound data 294 from the host device via the host interface 262. The host interface 262 routes the outbound data 294 to the digital transmitter processing module 276, which processes the outbound data 294 in accordance with a particular wireless communication standard (e.g., IEEE 802.11, Bluetooth, ZigBee, any other type of radio frequency based network protocol and/or variations thereof et cetera) to produce outbound baseband signals 296. The outbound baseband signals 296 will be digital base-band signals (e.g., have a zero IF) or digital low IF signals, where the low IF typically will be in the frequency range of one hundred kHz (kilo-Hertz) to a few MHz (Mega-Hertz).

The digital-to-analog converter 278 converts the outbound baseband signals 296 from the digital domain to the analog domain. The filtering/gain module 280 filters and/or adjusts the gain of the analog signals prior to providing it to the IF mixing stage 282. The IF mixing stage 282 converts the analog baseband or low IF signals into RF signals based on a transmitter local oscillation 283 provided by local oscillation module 274. The power amplifier 284 amplifies the RF signals to produce outbound RF signals 298, which are filtered by the transmitter filter module 285. The antenna 286 transmits the outbound RF signals 298 to a targeted device such as a base station, an access point and/or another wireless communication device 200.

The radio 260 also receives inbound RF signals 288 via the antenna 286, which were transmitted by a base station, an access point, or another wireless communication device. The antenna 286 provides the inbound RF signals 288 to the receiver filter module 271 via the Tx/Rx switch 273, where the Rx filter 271 bandpass filters the inbound RF signals 288. The Rx filter 271 provides the filtered RF signals to low noise amplifier 272, which amplifies the signals 288 to produce an amplified inbound RF signals. The low noise amplifier 272 provides the amplified inbound RF signals to the IF mixing module 270, which directly converts the amplified inbound RF signals into an inbound low IF signals or baseband signals based on a receiver local oscillation 281 provided by local oscillation module 274. The down conversion module 270 provides the inbound low IF signals or baseband signals to the filtering/gain module 268. The high pass and low pass filter module 268 filters, based on settings provided by the channel bandwidth adjust module 287, the inbound low IF signals or the inbound baseband signals to produce filtered inbound signals.

The analog-to-digital converter 266 converts the filtered inbound signals from the analog domain to the digital domain to produce inbound baseband signals 290, where the inbound baseband signals 290 will be digital base-band signals or digital low IF signals, where the low IF typically will be in the frequency range of one hundred kHz to a few MHz. The digital receiver processing module 264, based on settings provided by the channel bandwidth adjust module 287, decodes, descrambles, demaps, and/or demodulates the inbound baseband signals 290 to recapture inbound data 292 in accordance with the particular wireless communication standard being implemented by radio 260. The host interface 262 provides the recaptured inbound data 292 to the host device 118-132 via the radio interface 254.

As one of average skill in the art will appreciate, the wireless communication device 200 of FIG. 2 may be implemented using one or more integrated circuits. For example, the host device may be implemented on one integrated circuit, the digital receiver processing module 264, the digital transmitter processing module 276 and memory 275 may be implemented on a second integrated circuit, and the remaining components of the radio 260, less the antenna 286, may be implemented on a third integrated circuit. As an alternate example, the radio 260 may be implemented on a single integrated circuit. As yet another example, the processing module 250 of the host device and the digital receiver and transmitter processing modules 264 and 276 may be a common processing device implemented on a single integrated circuit. Further, the memory 252 and memory 275 may be implemented on a single integrated circuit and/or on the same integrated circuit as the common processing modules of processing module 250 and the digital receiver and transmitter processing module 264 and 276.

Figure 3:
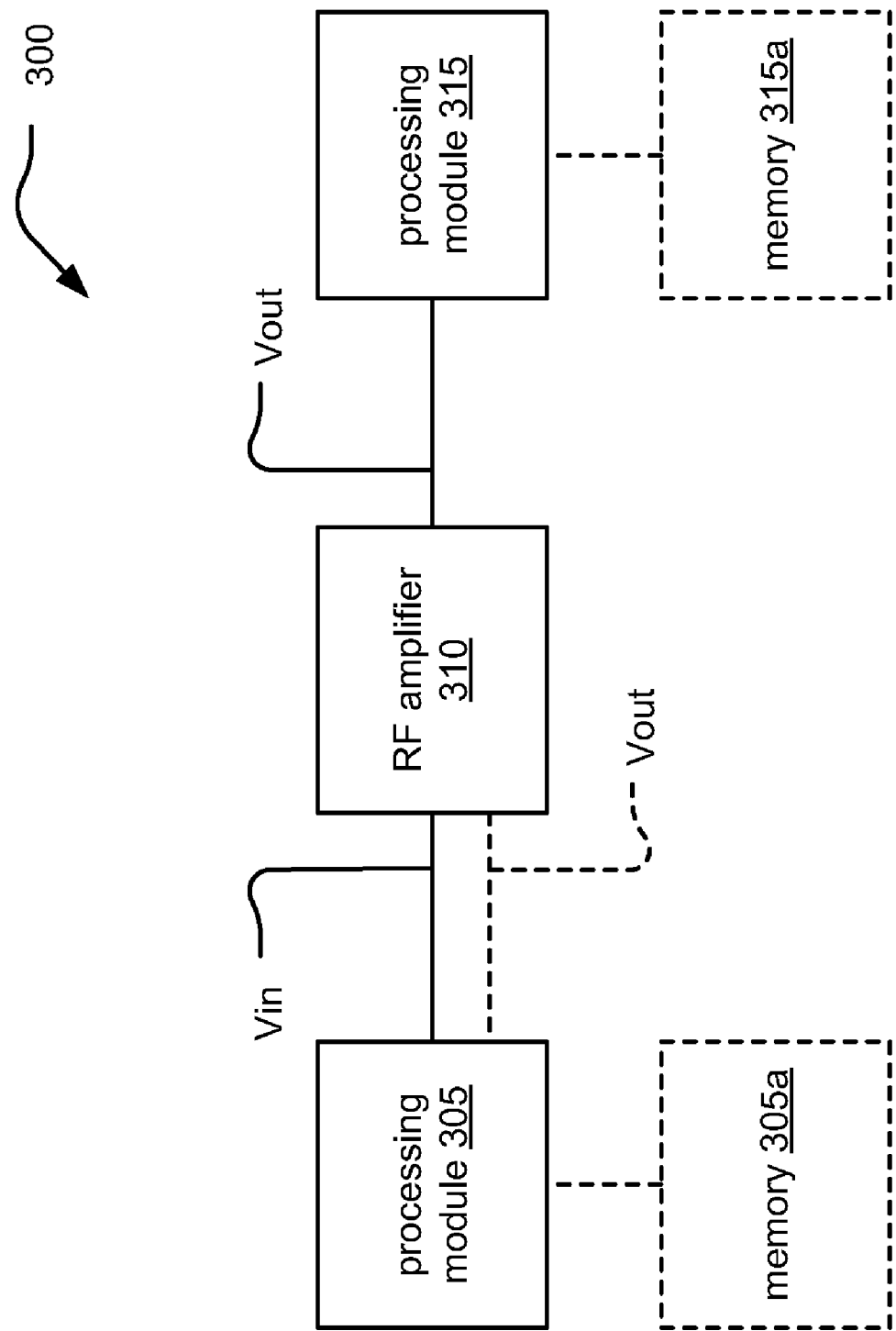
FIG. 3 is a diagram illustrating an embodiment of a communication device including a radio frequency (RF) amplifier.

FIG. 3 is a diagram illustrating an embodiment of a communication device 300 including a radio frequency (RF) amplifier 310. It is noted that the RF amplifier 310 (as well as other RF amplifiers described herein) could generally be implemented within any number of devices to provide for desired voltage gain as well without departing from the scope and spirit of the invention. In other words, while various embodiments herein depict RF amplifiers, it is noted that such RF amplifiers can generally be implemented as 'amplifiers' within various devices without departing from the scope and spirit of the invention.

The communication device 300 includes processing module 305 and can also include processing module 315. Either of the processing modules 305 and 315 described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory (e.g., such as memory 305a coupled to the processing module 305 or the memory 315a coupled to the processing module 315). The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

In this embodiment, the processing module 305 provides an input voltage (Vin) to the RF amplifier 310, and the RF amplifier 310 outputs an output voltage (Vout) that is an amplified version of the input voltage (Vin). The output voltage (Vout) can be provided to the processing module 315. In alternative embodiments, the output voltage (Vout) can be provided back to the same processing module 305 for use in some portion therein.

Figure 4:
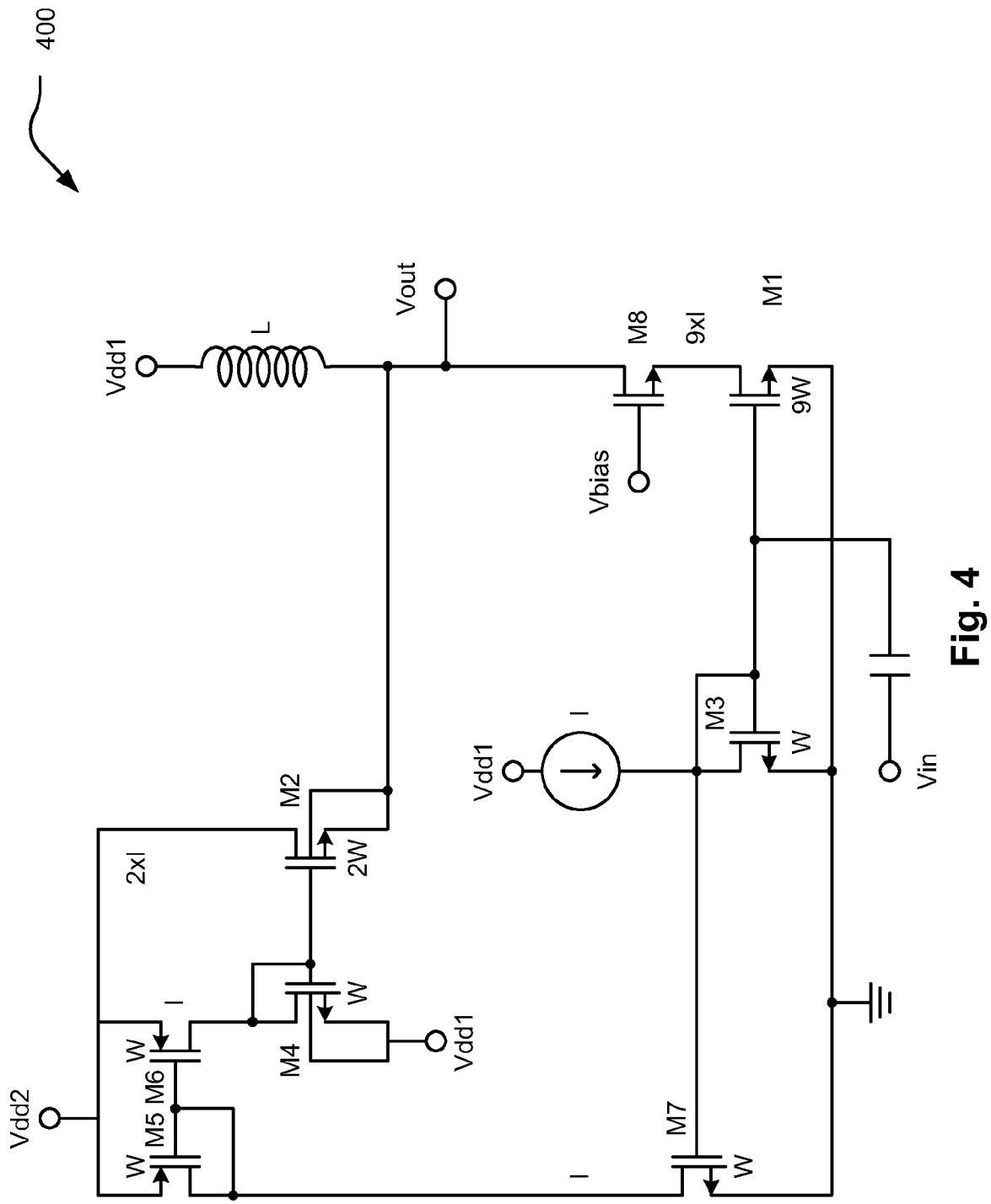
FIG. 4 is a diagram illustrating an embodiment of a RF amplifier circuitry such as can be employed within any number of communication devices.

FIG. 4 is a diagram illustrating an embodiment of a RF amplifier circuitry 400 such as can be employed within any number of communication devices. The RF amplifier circuitry 400 includes n-channel metal oxide semiconductor field-effect transistors (N-MOSFETs) (M3 and M1). A gate of the N-MOSFET (M3) is coupled to a gate of the N-MOSFET (M1). It is also noted that gate width of the N-MOSFET (M3) is less than a gate width of the N-MOSFET (M1). In this embodiment, the ratio is 9/1 (i.e., the gate width of the N-MOSFET (M1) is 9 times greater than the gate width of N-MOSFET (M3)—gate width of N-MOSFET (M3) is W and gate width of N-MOSFET (M1) is 9 W). However, it is noted that other ratios can alternatively be employed without departing from the scope and spirit of the invention.

An input voltage (Vin) is provided to the coupled gates of the N-MOSFET (M3) and the N-MOSFET (M1). Another N-MOSFET (M8) is implemented such that a bias voltage (Vbias) is provided to a gate of the N-MOSFET (M8). A source of the N-MOSFET (M8) is coupled to a drain of the N-MOSFET (M1).

An output voltage (Vout) is provided from a drain of the N-MOSFET (M8). Also, an inductor (L) is coupled between the drain of the N-MOSFET (M8) and a power supply voltage (shown as Vdd1). This RF amplifier circuitry 400 can employ two separate power supply voltages, as depicted by Vdd1 and Vdd2.

As is described in subsequent embodiments, it is noted that a variation of the RF amplifier circuitry 400 can also be implemented to provide for different voltage gains (e.g., a variation of the RF amplifier circuitry 400 can have a selectable gain).

Another N-MOSFET (M7) is employed to form a pair current mirror with the N-MOSFET (M3). A drain of the N-MOSFET (M3) is coupled to a gate of the N-MOSFET (M3) and also coupled to a gate of the N-MOSFET (M7). The gate width of the N-MOSFET (M7) can be implemented to be the same as that of the N-MOSFET (M3) (i.e., both have gate width of W).

Also, a current supply providing current "I" can be implemented and power by a power supply voltage (Vdd1). A drain of the N-MOSFET (M3) is coupled to a gate of the N-MOSFET (M3), and the current supply injects the current "I" into a node of the coupled gate and drain of the N-MOSFET (M3).

In addition, the RF amplifier circuitry 400 can include another pair of N-MOSFETs (M4 and M2) such that the N-MOSFET (M4) is implemented in a tri-well configuration such that the body effect can be eliminated. The N-MOSFET (M2) is implemented such that a source of the N-MOSFET (M2) is connected to its own well, and the N-MOSFET (M4) is implemented such that a source of the N-MOSFET (M4) is connected to its own well. A gate of the N-MOSFET (M4) is coupled to a gate of the N-MOSFET (M2), and a gate of the N-MOSFET (M4) is coupled to a drain of the N-MOSFET (M4). A source of the N-MOSFET (M4) is coupled to the power supply voltage (Vdd1), and a source of the N-MOSFET (M2) is coupled to a drain of the N-MOSFET (M8).

Also, a p-channel metal oxide semiconductor field-effect transistors (P-MOSFET) (M6) can be implemented such that a drain of the P-MOSFET (M6) is coupled to the drain of the N-MOSFET (M4). Another P-MOSFET (M5) can be implemented such that a drain of the P-MOSFET (M5) is coupled to a gate of the P-MOSFET (M5) and also coupled to a gate of the P-MOSFET (M6). Both P-MOSFETs (M5 and M6) form a pair current mirror.

Each of the source of the P-MOSFET (M5), a source of the P-MOSFET (M6), and a drain of the N-MOSFET (M2) are coupled to at least one additional power supply voltage (e.g., shown as Vdd2).

The inductor L creates a large impedance at high frequencies; therefore, the gain of the RF amplifier circuitry 400 can be described as follows:

$$Av = \frac{gm1}{gm2} = \sqrt{\frac{2\mu C_{ox} \frac{W_1}{L_1} I_{d1}}{2\mu C_{ox} \frac{W_2}{L_2} I_{d2}}} = \sqrt{\frac{W_1}{W_2} \frac{I_{d1}}{I_{d2}}},$$

where

μ is the electron mobility;
$C_{ox}$ is the oxide thickness;
$W_i$ is the gate width of N-MOSFET (Mi);
$L_i$ is the length of N-MOSFET (Mi); and
$I_{di}$ is the drain current of N-MOSFET (Mi).

Within the embodiment of the RF amplifier circuitry 400, the ratio of the gate widths of the N-MOSFET (M1) and the N-MOSFET (M2) is 9 W/2 W or 9/2. Also, the ratio of the currents flowing into the drains of the N-MOSFET (M1) and the N-MOSFET (M2) is (9×I)/(2×I) or 9/2. Based on these particular parameters of this particular embodiment, it can be seen that the overall voltage gain of such an embodiment of an RF amplifier circuitry 400 is:

$$Av = \sqrt{\frac{W_1}{W_2} \frac{I_{d1}}{I_{d2}}} = \sqrt{\frac{9 \times W}{2 \times W} \frac{9 \times I}{2 \times I}} = 4.5 = 13 \text{ dB}$$

Moreover, this embodiment shows the use of the appropriately placed N-MOSFET (M3) to provide the desired input impedance (e.g., 50Ω). Again, as mentioned above, the novel design presented herein provides for a voltage gain that is implemented using a ratio of various elements within the circuitry (e.g., gate widths, currents through various paths within the circuitry etc.), and as such, is immune to variations in temperature, power supply voltage, process variations, and/or other perturbations which affect all of the circuitry.

This design also ensures a relatively high IIP3 ($3^{rd}$ order input intercept point or $3^{rd}$ order intermodulation intercept point). In other words, there is a relatively low likelihood that this novel amplifier circuitry design will suffer from undesirable intermodulation effects generated by interference from other devices.

The MOSFETs can be connected using a triple well (alternatively referred to as "tri-well") configuration (e.g., in which a source of a particular MOSFET is coupled to its own well). This can be performed to eliminate body effects therein.

Also, while this particular embodiment uses multiple N-MOSFETs (some of which are triple well connected) and P-MOSFETs. However, it is noted that such a design can alternatively be implemented using P-MOSFETs and N-MOSFETs as well without departing from the scope and spirit of the invention.

It is noted that the entirety of the RF amplifier circuitry 400 can be implemented within a single integrated circuit or a combination of integrated circuits. Moreover, the RF amplifier circuitry 400 can be implemented may be implemented within any number of types of wireless communication devices that is may themselves be employed and used within a wireless communication system.

Figure 5:
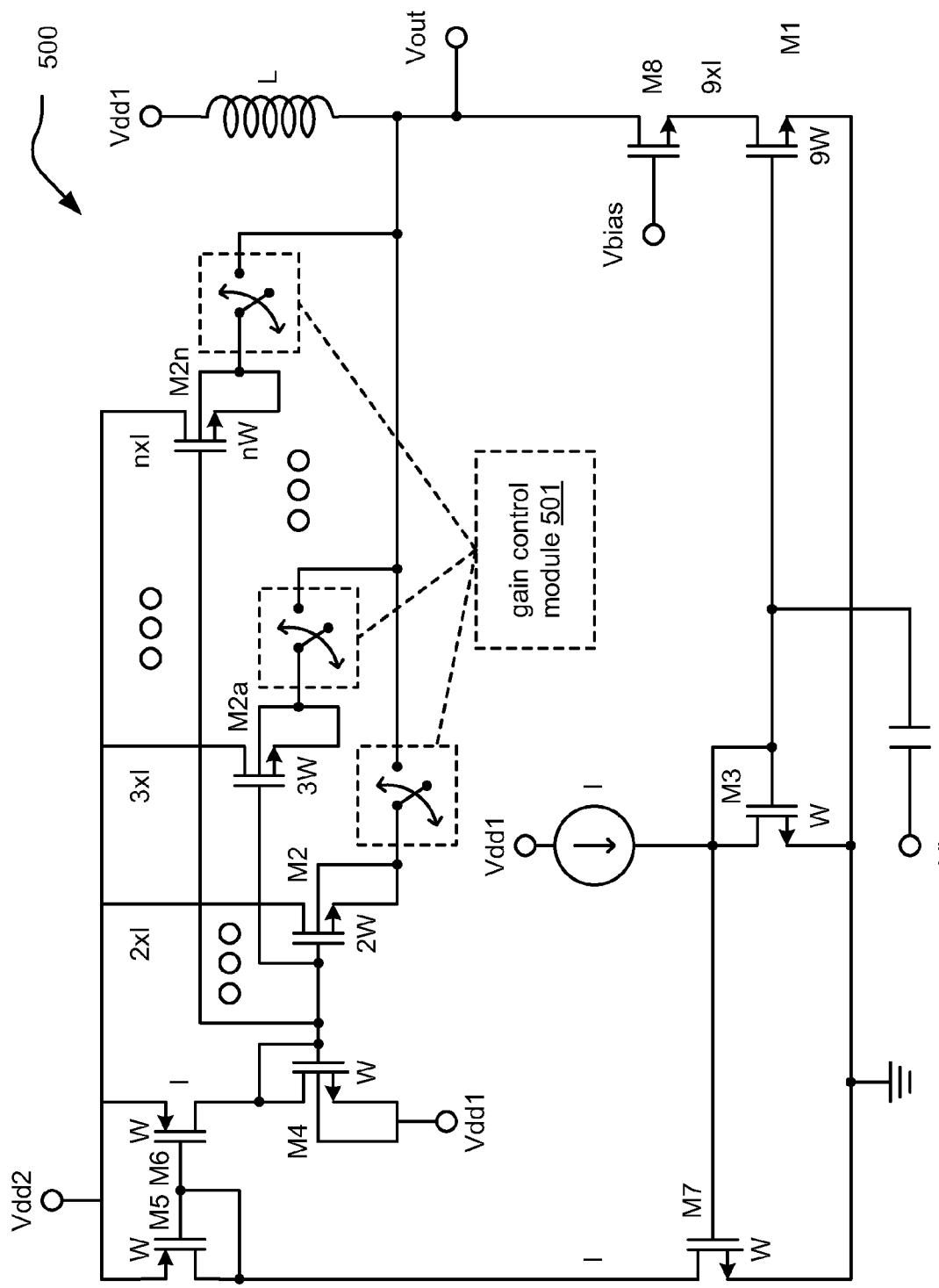
FIG. 5 is a diagram illustrating an alternative embodiment of a RF amplifier circuitry (having selectable gain) such as can be employed within any number of communication devices.

FIG. 5 is a diagram illustrating an alternative embodiment of a RF amplifier circuitry 500 (having selectable gain) such as can be employed within any number of communication devices. This embodiment shows the use of an array of N-MOSFETs (M2, M2a, . . . , up to M2n) with switches to have different gain settings. A gain control module 501 can be employed to select which one of the particular gains is to be employed at any given time. For example, such a gain control module 501 could select only one of the switches coupled to one N-MOSFET within the array of N-MOSFETs (M2, M2a, . . . , up to M2n) to be closed at any given time.

Looking at this particular example, the gain provided by the RF amplifier circuitry 500 could be any one of the following:

$$Av = \sqrt{\frac{W_1}{W_2} \frac{I_{d1}}{I_{d2}}} = \sqrt{\frac{9 \times W}{2 \times W} \frac{9 \times I}{2 \times I}} = 4.5;$$

$$Av = \sqrt{\frac{W_1}{W_{2a}} \frac{I_{d1}}{I_{d2a}}} = \sqrt{\frac{9 \times W}{3 \times W} \frac{9 \times I}{3 \times I}} = 3;$$

or any intermediate value up to $$Av = \sqrt{\frac{W_1}{W_{2n}} \frac{I_{d1}}{I_{d2n}}} = \sqrt{\frac{9 \times W}{n \times W} \frac{9 \times I}{n \times I}} = 9/n^2.$$

Clearly, also the values of the ratios of the gate widths and currents provided into the drains of each of the N-MOSFETs (M1 and M3) could also be varied as well in different embodiments. This would provide a designer with even greater flexibility in arriving at a solution to provide any particular desired gain.

Figure 6:
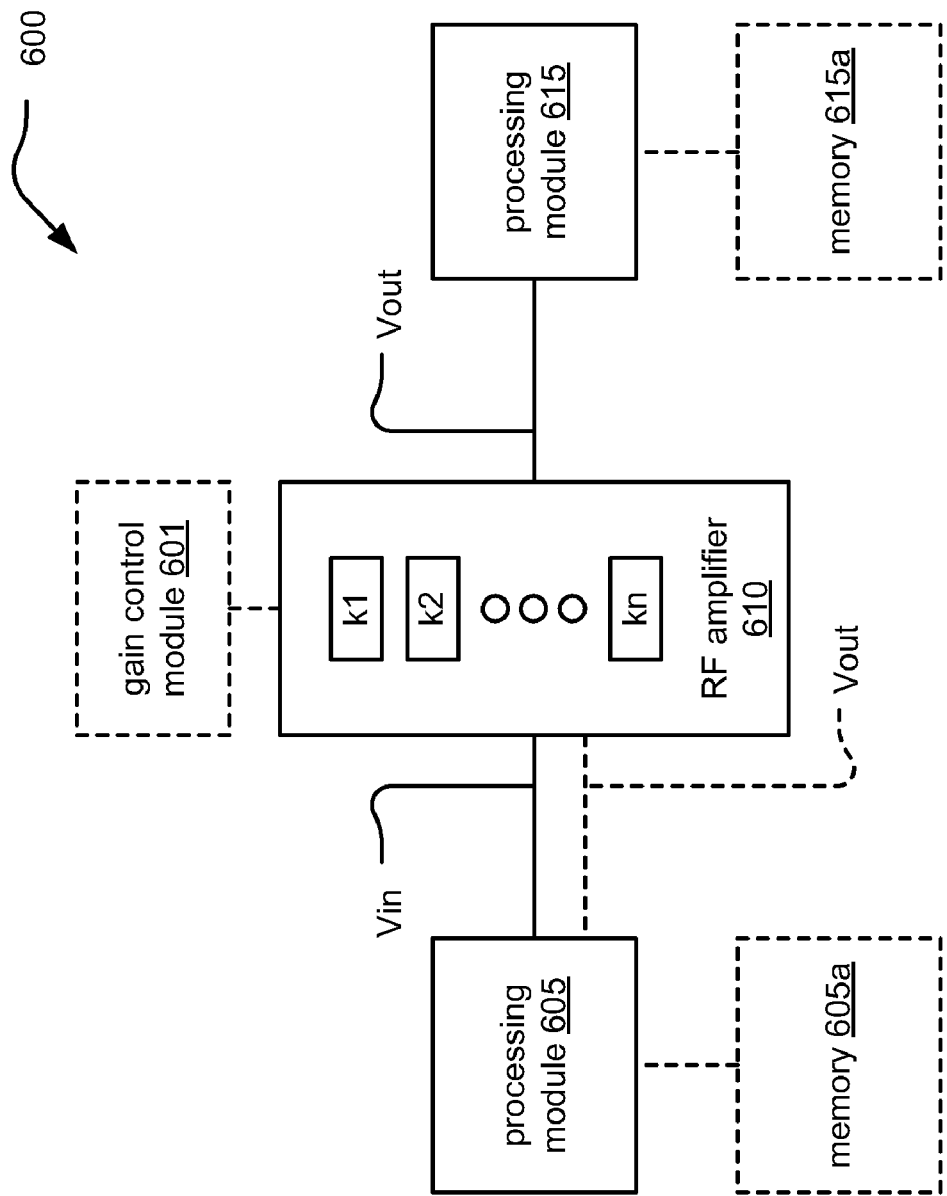
FIG. 6 is a diagram illustrating an embodiment of a communication device including a RF amplifier having variable gain.

FIG. 6 is a diagram illustrating an embodiment of a communication device 600 including a RF amplifier 610 having variable gain. The communication device 600 includes processing module 605 and can also include processing module 615. Either of the processing modules 605 and 615 described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory (e.g., such as memory 605a coupled to the processing module 605 or the memory 615a coupled to the processing module 615). The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

In this embodiment, the processing module 605 provides an input voltage (Vin) to the amplifier 610, and the amplifier 610 outputs an output voltage (Vout) that is an amplified version of the input voltage (Vin). The output voltage (Vout) can be provided to the processing module 615. In alternative embodiments, the output voltage (Vout) can be provided back to the same processing module 605 for use in some portion therein.

In this embodiment, the embodiment can provide any one of a number of different gains (e.g., shown as k1, k2, ..., and up to kn). The amplifier 610 can itself perform the selection of which gain to employ at a particular time (which can be predetermined or adaptive based on some other parameter within the communication device 600 and/or communication system in which the communication device 600 is implemented). Alternatively, a gain control module 601 can be implemented to select which gain is to be employed at any given time by the amplifier 610.

It is noted that the various modules (e.g., processing modules, amplifier circuitries, gain control modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An amplifier circuitry, the circuitry comprising:
   first and second n-channel metal oxide semiconductor field-effect transistors (N-MOSFETs), wherein:
      a gate of the first N-MOSFET is directly connected to a gate of the second N-MOSFET; and
      a gate width of the first N-MOSFET is less than a gate width of the second N-MOSFET; and
      an input voltage is provided to the directly connected gates of the first N-MOSFET and the second N-MOSFET;
   a third N-MOSFET, wherein:
      a bias voltage is provided to a gate of the third N-MOSFET;
      a source of the third N-MOSFET is coupled to a drain of the second N-MOSFET; and
      an output voltage is provided from a drain of the third N-MOSFET; and
   an inductor that is coupled between the drain of the third N-MOSFET and a power supply voltage.

2. The circuitry of claim 1, wherein:
   the circuitry is operable to amplify the input voltage by any one gain of a plurality of gains thereby generating the output voltage.

3. The circuitry of claim 1, further comprising:
   a fourth N-MOSFET forms a pair current mirror with the first N-MOSFET; and wherein:
   a drain of the first N-MOSFET is coupled to a gate of the first N-MOSFET and also coupled to a gate of the fourth N-MOSFET.

4. The circuitry of claim 1, further comprising:
   a current supply; and wherein:
   a drain of the first N-MOSFET is coupled to a gate of the first N-MOSFET; and
   the current supply injects a current into a node of the coupled gate and drain of the first N-MOSFET.

5. The circuitry of claim 1, further comprising:
   a fourth N-MOSFET forms a pair current mirror with the first N-MOSFET, wherein:
      the source of the fourth N-MOSFET is also coupled to a ground voltage; and
      a drain of the first N-MOSFET is coupled to a gate of the first N-MOSFET and also coupled to a gate of the fourth N-MOSFET;
   fifth and sixth N-MOSFETs, wherein:
      each of the fifth N-MOSFET and the sixth N-MOSFET is implemented in a tri-well configuration such that a source of the fifth N-MOSFET is connected to a well of the fifth N-MOSFET and a source of the sixth N-MOSFET is connected to a well of the sixth N-MOSFET;
      a gate of the fifth N-MOSFET is coupled to a gate of the sixth N-MOSFET;

a gate of the fifth N-MOSFET is coupled to a drain of the fifth N-MOSFET;
a source of the fifth N-MOSFET is coupled to the power supply voltage; and
a source of the sixth N-MOSFET is coupled to a drain of the third N-MOSFET.

6. The circuitry of claim 1, further comprising:
a fourth N-MOSFET forms a pair current mirror with the first N-MOSFET, wherein:
the source of the fourth N-MOSFET is also coupled to a ground voltage; and
a drain of the first N-MOSFET is coupled to a gate of the first N-MOSFET and also coupled to a gate of the fourth N-MOSFET;
fifth and sixth N-MOSFETs, wherein:
each of the fifth N-MOSFET and the sixth N-MOSFET is implemented in a tri-well configuration such that a source of the fifth N-MOSFET is connected to a well of the fifth N-MOSFET and a source of the sixth N-MOSFET is connected to a well of the sixth N-MOSFET;
a gate of the fifth N-MOSFET is coupled to a gate of the sixth N-MOSFET;
a gate of the fifth N-MOSFET is coupled to a drain of the fifth N-MOSFET; and
a source of the sixth N-MOSFET is coupled to a drain of the third N-MOSFET;
first and second p-channel metal oxide semiconductor field-effect transistors (P-MOSFET), wherein:
a gate of the first P-MOSFET is coupled to the gate of the second N-MOSFET;
a drain of the first P-MOSFET is coupled to a gate of the first P-MOSFET and also coupled to the gate of the second P-MOSFET.

7. The circuitry of claim 6, wherein:
a drain of the sixth N-MOSFET, a source of the first P-MOSFET, and a source of the second P-MOSFET are coupled to at least one additional power supply voltage.

8. The circuitry of claim 1, wherein:
the circuitry is an integrated circuit.

9. The circuitry of claim 1, wherein:
the circuitry is implemented within a wireless communication device.

10. An amplifier circuitry, the circuitry comprising:
first and second n-channel metal oxide semiconductor field-effect transistors (N-MOSFETs), wherein:
a gate of the first N-MOSFET is coupled to a gate of the second N-MOSFET;
a gate width of the first N-MOSFET is less than a gate width of a second N-MOSFET; and
a drain of the first N-MOSFET is coupled to a gate of the first N-MOSFET; and
an input voltage is provided to the coupled gates of the first N-MOSFET and the second N-MOSFET;
a third N-MOSFET, wherein:
a bias voltage is provided to a gate of the third N-MOSFET;
a source of the third N-MOSFET is coupled to a drain of the second N-MOSFET; and
an output voltage is provided from a drain of the third N-MOSFET; and
an inductor that is coupled between the drain of the third N-MOSFET and a power supply voltage;
a fourth N-MOSFET forms a pair current mirror with the first N-MOSFET, wherein the coupled gate and drain of the first N-MOSFET is also coupled to a gate of the fourth N-MOSFET; and a current supply that injects a current into a node of the coupled gate and drain of the first N-MOSFET; and wherein:
the circuitry is operable to amplify the input voltage by any one gain of a plurality of gains thereby generating the output voltage.

11. The circuitry of claim 10, further comprising:
fifth and sixth N-MOSFETs, wherein:
each of the fifth N-MOSFET and the sixth N-MOSFET is implemented in a tri-well configuration such that a source of the fifth N-MOSFET is connected to a well of the fifth N-MOSFET and a source of the sixth N-MOSFET is connected to a well of the sixth N-MOSFET;
a gate of the fifth N-MOSFET is coupled to a gate of the sixth N-MOSFET;
a gate of the fifth N-MOSFET is coupled to a drain of the fifth N-MOSFET;
a source of the fifth N-MOSFET is coupled to the power supply voltage;
a source of the sixth N-MOSFET is coupled to a drain of the third N-MOSFET; and
a gate width of the sixth N-MOSFET is twice as large as a gate width of the fifth N-MOSFET.

12. The circuitry of claim 10, further comprising:
fifth and sixth N-MOSFETs, wherein:
each of the fifth N-MOSFET and the sixth N-MOSFET is implemented in a tri-well configuration such that each of a source of the fifth N-MOSFET and a source of the sixth N-MOSFET is connected to a substrate of the circuitry;
a gate of the fifth N-MOSFET is coupled to a gate of the sixth N-MOSFET;
a gate of the fifth N-MOSFET is coupled to a drain of the fifth N-MOSFET; and
a source of the sixth N-MOSFET is coupled to a drain of the third N-MOSFET;
first and second p-channel metal oxide semiconductor field-effect transistors (P-MOSFET), wherein:
a gate of the first P-MOSFET is coupled to the gate of the second N-MOSFET;
a drain of the first P-MOSFET is coupled to a gate of the first P-MOSFET and also coupled to the gate of the second P-MOSFET.

13. The circuitry of claim 12, wherein:
a drain of the sixth N-MOSFET, a source of the first P-MOSFET, and a source of the second P-MOSFET are coupled to at least one additional power supply voltage.

14. The circuitry of claim 10, wherein:
the circuitry is an integrated circuit.

15. The circuitry of claim 10, wherein:
the circuitry is implemented within a wireless communication device.

16. An amplifier circuitry, the circuitry comprising:
first and second n-channel metal oxide semiconductor field-effect transistors (N-MOSFETs), wherein:
each of the first N-MOSFET and the second N-MOSFET is implemented in a tri-well configuration such that each of a source of the first N-MOSFET and a source of the second N-MOSFET is connected to a substrate of the circuitry;
a gate of the first N-MOSFET is coupled to a gate of the second N-MOSFET; and
a gate width of the first N-MOSFET is less than a gate width of a second N-MOSFET; and
an input voltage is provided to the coupled gates of the first N-MOSFET and the second N-MOSFET;

a third N-MOSFET, wherein:
  a bias voltage is provided to a gate of the third N-MOSFET;
  a source of the third N-MOSFET is coupled to a drain of the second N-MOSFET; and
  an output voltage is provided from a drain of the third N-MOSFET; and
an inductor that is coupled between the drain of the third N-MOSFET and a first power supply voltage;
a fourth N-MOSFET forms a pair current mirror with the first N-MOSFET, wherein:
  the source of the fourth N-MOSFET is also coupled to a ground voltage; and
  a drain of the first N-MOSFET is coupled to a gate of the first N-MOSFET and also coupled to a gate of the fourth N-MOSFET;
fifth and sixth N-MOSFETs, wherein:
  each of the fifth N-MOSFET and the sixth N-MOSFET is implemented in a tri-well configuration such that each of a source of the fifth N-MOSFET and a source of the sixth N-MOSFET is connected to a substrate of the circuitry;
  a gate of the fifth N-MOSFET is coupled to a gate of the sixth N-MOSFET;
  a gate of the fifth N-MOSFET is coupled to a drain of the fifth N-MOSFET; and
  a source of the sixth N-MOSFET is coupled to a drain of the third N-MOSFET;
first and second p-channel metal oxide semiconductor field-effect transistors (P-MOSFET), wherein:
  a gate of the first P-MOSFET is coupled to the gate of the second N-MOSFET;
  a drain of the first P-MOSFET is coupled to a gate of the first P-MOSFET and also coupled to the gate of the second P-MOSFET; and
  a drain of the sixth N-MOSFET, a source of the first P-MOSFET, and a source of the second P-MOSFET are coupled to a second power supply voltage; and wherein:
the sixth N-MOSFET is one N-MOSFET of a plurality of N-MOSFETs implemented such that a source of only the one N-MOSFET of the plurality of N-MOSFETs is coupled to the drain of the third N-MOSFET; and
the circuitry is operable to amplify the input voltage by any one gain of a plurality of gains thereby generating the output voltage.

17. The circuitry of claim 16, further comprising:
a current supply; and wherein:
the current supply injects a current into a node of the coupled gate and drain of the first N-MOSFET.

18. The circuitry of claim 16, wherein:
a gate width of the sixth N-MOSFET is twice as large as a gate width of the fifth N-MOSFET; and
a gate width of the first P-MOSFET is same as a gate width of the second P-MOSFET.

19. The circuitry of claim 16, wherein:
the circuitry is an integrated circuit.

20. The circuitry of claim 16, wherein:
the circuitry is implemented within a wireless communication device.

* * * * *